(12) United States Patent
Nandakumar et al.

(10) Patent No.: US 6,960,499 B2
(45) Date of Patent: Nov. 1, 2005

(54) DUAL-COUNTERDOPED CHANNEL FIELD EFFECT TRANSISTOR AND METHOD

(75) Inventors: Mahalingam Nandakumar, Richardson, TX (US); Karthik Vasanth, Dallas, TX (US); Ih-Chin Chen, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/866,469

(22) Filed: Jun. 14, 2004

(65) Prior Publication Data

US 2004/0224457 A1 Nov. 11, 2004

Related U.S. Application Data

(62) Division of application No. 09/252,514, filed on Feb. 18, 1999, now abandoned.
(60) Provisional application No. 60/075,813, filed on Feb. 24, 1998.

(51) Int. Cl.$^7$ .............................................. H01L 21/336
(52) U.S. Cl. ........................................ 438/197; 438/289
(58) Field of Search .................................. 438/197, 289

(56) References Cited

U.S. PATENT DOCUMENTS

| 5,548,143 | A | * | 8/1996 | Lee ............................. 257/269 |
| 5,586,073 | A | * | 12/1996 | Hiura et al. ............ 365/185.01 |
| 5,786,620 | A | * | 7/1998 | Richards et al. ............. 257/408 |
| 5,923,987 | A | * | 7/1999 | Burr ............................. 438/304 |
| 6,117,691 | A | * | 9/2000 | Hsu et al. ......................... 438/3 |
| 6,121,666 | A | * | 9/2000 | Burr ............................. 257/408 |

* cited by examiner

*Primary Examiner*—Thao P. Le
(74) *Attorney, Agent, or Firm*—Jacqueline J. Garner; Wade James Brady, III; Frederick J. Telecky, Jr.

(57) ABSTRACT

A field effect transistor with a dual-counterdoped channel is disclosed. The transistor features a channel comprising a first doped region (28) and a second doped region (26) underlying the first doped region. A source and drain (32) are formed adjacent to the channel. In one embodiment of the present invention, the first doped region (28) is doped with arsenic, while the second doped region (26) is doped with phosphorus. The high charge-carrier mobility of the subsurface channel layer (28) allowing a lower channel dopant concentration to be used, which in turn allows lower source/drain pocket doping. This reduces the capacitance and response time of the transistor.

9 Claims, 2 Drawing Sheets

DUAL-COUNTERDOPED CHANNEL FIELD EFFECT TRANSISTOR AND METHOD

This application is a division of Ser. No. 09/252,514, filed Feb. 18, 1999 now abandoned, which claims priority under 35 U.S.C. from provisional application Ser. No. 60/075,813, filed Feb. 24, 1998.

TECHNICAL FIELD OF THE INVENTION

This invention relates generally to semiconductor devices and more particularly to a dual-counterdoped channel field effect transistor and method.

BACKGROUND OF THE INVENTION

In the art of field effect transistor (FET) design, it is desirable to minimize the leakage (off-state) current while maximizing the drive (on-state) current of the FET. One known method for achieving this result is to surround the source and drain regions with pockets or halos of doping, while counterdoping the channel region. This practice minimizes the short-channel effects that negatively affect the performance of small-scale FETs. However, to achieve this result, a high level of doping is necessary in the pockets around the source and drain regions to counteract the effect of the counterdoping in the channel. The high level of doping results in high source and drain capacitances, thus decreasing the switching speed of the FET.

SUMMARY OF THE INVENTION

Therefore, a need has arisen for an improved field effect transistor that addresses the disadvantages and deficiencies of the prior art.

A field effect transistor with a dual-counterdoped channel in accordance with the present invention is disclosed. The transistor features a channel comprising first and second doped regions. The second doped region underlies the first doped region. A source and drain are formed adjacent to the channel. In one embodiment of the present invention, the first doped region comprises an arsenic dopant, while the second doped region comprises a phosphorus dopant.

A technical advantage is that subsurface channel layer is formed in the central portion of the channel that has greater charge-carrier mobility than conventional surface channels, thus allowing a lower dopant concentration to be used in the subsurface channel layer without negatively affecting transistor performance. Another technical advantage is that the lower subsurface channel doping allows lower source/drain pocket doping, thus reducing the capacitance and response time of the transistor. Yet another technical advantage is that the channel length of the transistor may be decreased without increasing the capacitance and response time of the transistor to unacceptable levels. Yet another technical advantage is that chip size may be reduced, thereby increasing yield from a single wafer and decreasing chip cost.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

FIGS. 1A through 1E illustrate a method for forming a semiconductor device having a dual-counterdoped channel field effect transistor in accordance with the present invention.

Figure 1A:
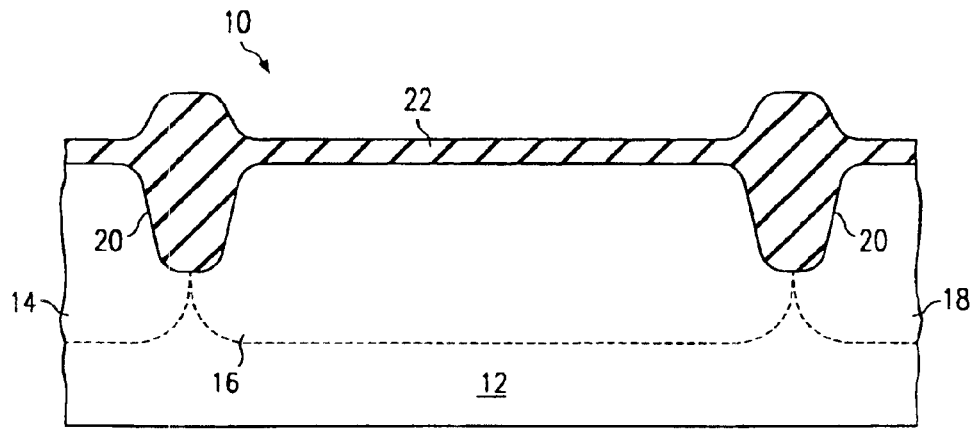
FIGS. 1A through 1E are side views of a semiconductor device in various stages of fabrication in accordance with one embodiment of the present invention.

Referring to FIG. 1A, a cross section of a semiconductor device 10 during fabrication is shown. Semiconductor device 10 includes a substrate 12 which comprises silicon, silicon on insulator (SOI), or any other appropriate substrate for semiconductor fabrication. A plurality of doped wells 14, 16 and 18 are formed in substrate 12 using well-known techniques. For example, well 16 may be a p-type well, while wells 14 and 18 may be n-type wells. For purposes of illustration, well 16 will be assumed to be a p-type well in the following description. However, it will be understood that well 16 may be an n-type well, with the appropriate substitution of n-type dopants for p-type dopants (and vice versa) throughout the following description.

Wells 14, 16 and 18 are separated by isolation trenches 20, which may be filled with an insulating material such as silicon dioxide in accordance with known isolation techniques. Alternatively, other forms of isolation, such as LOCOS isolation, may be used. An insulating layer 22 covers the surface of substrate 12. Insulating layer 22 may also comprise silicon dioxide.

Figure 1B:
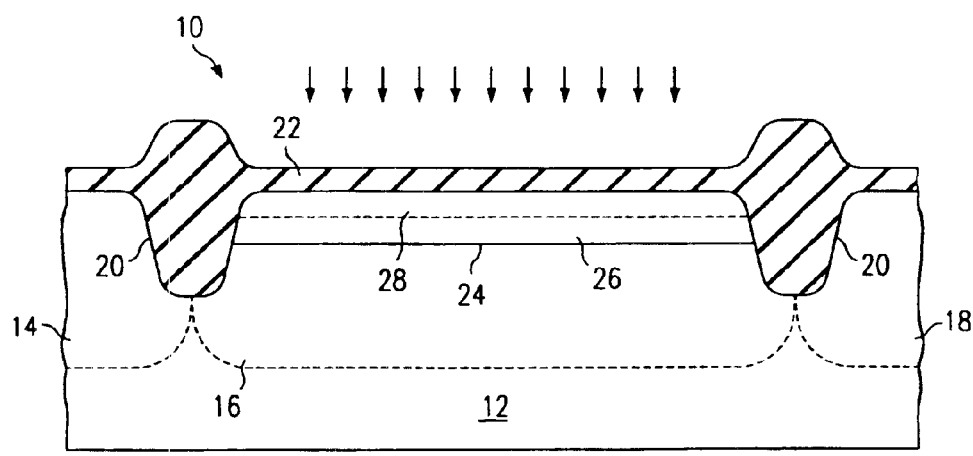

Referring to FIG. 1B, a channel region 24 of substrate 12 is counterdoped with n-type dopants in accordance with the present invention. One ion implantation is performed to form a subsurface doped layer 26. In this example, the dopant used for this implantation is phosphorus. Another ion implantation is performed to form a surface doped layer 28. In this example, the dopant used for this implantation is arsenic. Alternatively, surface layer 28 may not be doped at all. Additional implementation of p-type dopants may also be performed to adjust threshold voltage and for punch-through control.

Figure 1C:
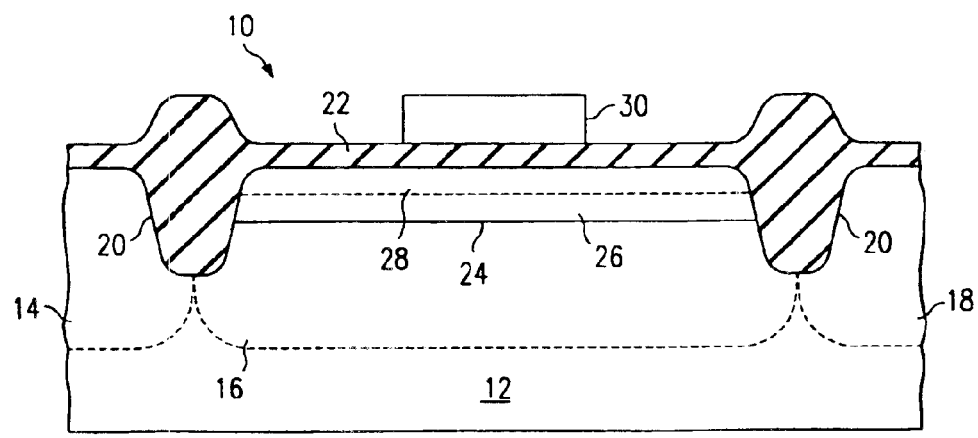

Referring to FIG. 1C, a gate material such as polysilicon is deposited and patterned to form gate 30. This step may be performed in accordance with well known gate formation techniques.

Figure 1D:
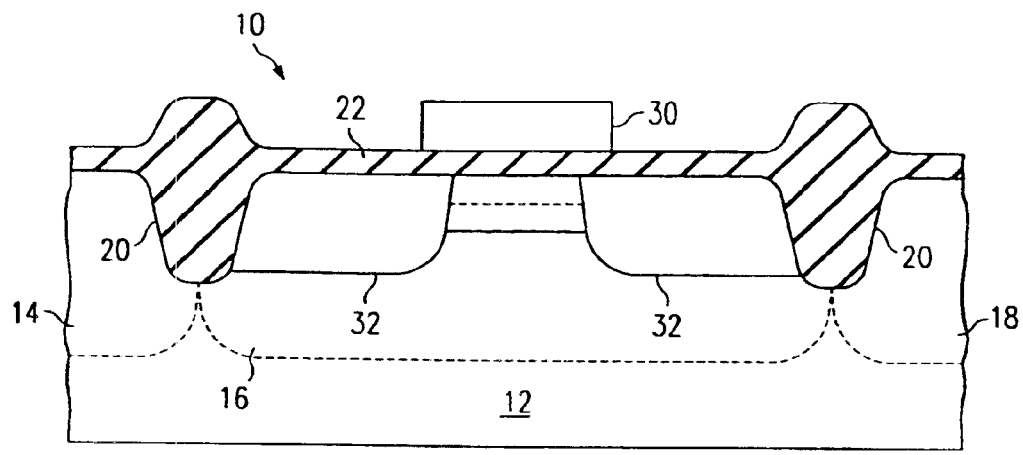

Referring to FIG. 1D, source/drain pockets 32 are formed using ion implantation. In this example, source/drain pockets 32 are implanted with a p-type material such as indium. Preferably, a heavy element such as indium (for p-doped pockets) or arsenic or antimony (for n-doped pockets) is used to form source/drain pockets 32. Heavy elements are preferred because of their relatively narrow and steep doping profile. In other words, these heavy dopants create a sharp transition in dopant concentration between source/drain pockets 32 and substrate 12. This sharp transition in dopant concentration reduces the deleterious short-channel effects exhibited by semiconductor device 10. Alternatively, lighter dopants such as boron ($BF_2$) and phosphorus may be used.

Figure 1E:
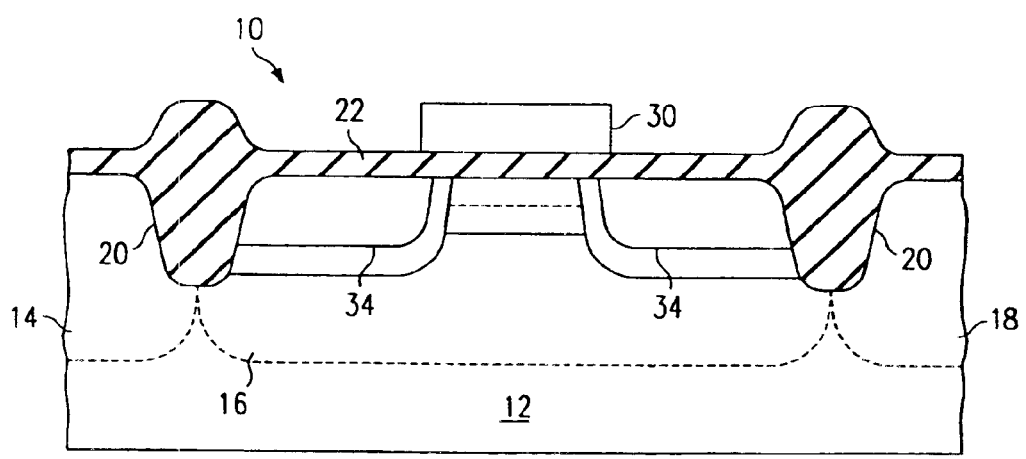

Referring to FIG. 1E, source/drain regions 34 are formed using ion implantation. In this example, source/drain pockets 32 are implanted with an n-type material such as arsenic. Although source/drain pockets 32 are shown extending around source/drain region 34 and adjoining isolation trenches 20, it will be understood that source/drain pockets 32 may extend only along the inside portion of source/drain regions 34 adjoining the channel. Alternatively, a deeper source/drain implant may be performed to extend source/drain regions 34 over the bottom portion of source/drain pockets 32. Either one of these well-known methods reduces the capacitance of the transistor, thereby improving transistor performance.

The transistor formed by the foregoing steps exhibits superior performance over previous transistors. Specifically, this transistor utilizes subsurface doped layer 26 as the primary conduction channel between source/drain regions 34. Subsurface doped layer 26 has greater charge-carrier mobility than conventional surface channels. A desired channel conductivity may therefore be achieved with a lower n-type dopant concentration in subsurface doped layer 26. Since source/drain pockets 32 must be sufficiently p-doped to overcome the counterdoping of channel region 24, the lower n-type dopant concentration allows a lower p-type dopant concentration to be used in source/drain pockets 32. The reduced source/drain pocket doping reduces the capacitance and the response time of the transistor. Channel 24 may therefore be shortened, with a corresponding increase in source/drain pocket dopant concentration, without increasing the capacitance and response time of the transistor to unacceptable levels. The overall size of semiconductor device 10 is thereby reduced, increasing the yield from a single wafer and decreasing the cost of a chip. Alternatively, the above-described method could be used to reduce short-channel effects and improve transistor performance for a given pocket doping level.

While the invention has been particularly shown and described by the foregoing detailed description, it will be understood by those skilled in the art that various other changes in form and detail may be made without departing from the spirit and scope of the invention.

What is claimed is:

1. A method for forming a field effect transistor, comprising the steps of:
    providing a region of semiconductor material doped a first conductivity type;
    forming spaced apart source/drain pockets of said first conductivity type in said region of semiconductor material and counterdoped regions of opposite conductivity type disposed within each of said source/drain pockets forming source/drains; and
    forming a channel region disposed in said region of semiconductor material between said source/drain pockets, said channel region having a first region of one of undoped or doped opposite conductivity type and a second doped region underlying the first region of said opposite conductivity type and having a greater charge-carrier mobility than said first region, said second doped region being the primary conduction channel between said source and said drain.

2. The method of claim 1, further comprising the step of implanting a third dopant in a channel region overlying the first region.

3. The method of claim 1, further comprising the step of implanting a fourth dopant in a pocket surrounding the source/drain region.

4. The method of claim 2, wherein the first dopant comprises phosphorus, and wherein the second dopant comprises a p-type dopant, and wherein the third dopant comprises arsenic.

5. A method for forming a field effect transistor, comprising the steps of:
    providing a region of semiconductor material doped a first conductivity type;
    forming a source region of said first conductivity type and a drain region of said first conductivity type, both said source region and said drain region disposed in said region of semiconductor material and separated by a channel region disposed in said region of semiconductor material;
    providing said channel region by forming a first region in said channel region of one of undoped or opposite conductivity counterdoped type; and
    doping said channel region with a dopant to form a second counterdoped region underlying the first region of said opposite conductivity type, said second doped region having a greater charge-carrier mobility than said first region, said second doped region being the primary conduction channel between said source region and said drain region.

6. The method of claim 5, wherein the counterdopants are an n-type dopants.

7. The method of claim 5, wherein the first doped region comprises a first dopant, and wherein the second doped region comprises a second dopant different from the first dopant.

8. The method of claim 7, wherein the first dopant comprises arsenic, and wherein the second dopant comprises phosphorus.

9. The method of claim 5, further comprising a first pocket surrounding the source, and a second pocket surround the drain, the first and second pockets each having a higher dopant concentration than the source and drain regions.

* * * * *